(12) United States Patent
Tsai et al.

(10) Patent No.: US 7,511,349 B2
(45) Date of Patent: Mar. 31, 2009

(54) CONTACT OR VIA HOLE STRUCTURE WITH ENLARGED BOTTOM CRITICAL DIMENSION

(75) Inventors: Ming-Huan Tsai, Hsinchu (TW); Fang-Cheng Chen, Hsin-Chu (TW); Chao-Cheng Chen, Shin-Chu County (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 423 days.

(21) Appl. No.: 11/207,450

(22) Filed: Aug. 19, 2005

(65) Prior Publication Data

US 2007/0040188 A1 Feb. 22, 2007

(51) Int. Cl.
*H01L 29/76* (2006.01)
*H01L 29/94* (2006.01)
*H01L 31/00* (2006.01)
*H01L 23/52* (2006.01)
*H01L 29/40* (2006.01)

(52) U.S. Cl. .................. 257/382; 257/751; 257/774; 257/775; 257/E29.112

(58) Field of Classification Search ............... 257/382, 257/751, 774, 775, E29.112
See application file for complete search history.

(56) References Cited

U.S. PATENT DOCUMENTS

| 5,619,071 | A | 4/1997 | Myers et al. |
| 6,169,010 | B1 | 1/2001 | Higashi |
| 6,191,025 | B1 | 2/2001 | Liu et al. |
| 6,383,943 | B1 | 5/2002 | Chen et al. |
| 6,395,642 | B1 | 5/2002 | Liu et al. |
| 6,476,489 | B1 * | 11/2002 | Yoo et al. ................ 257/754 |
| 6,548,905 | B2 | 4/2003 | Park et al. |
| 6,693,032 | B2 | 2/2004 | Yoo et al. |

OTHER PUBLICATIONS

Ge, C.-H., et al., "Process-Strained Si (PSS) CMOS Technology Featuring 3D Strain Engineering," 2003 IEEE.
Ghani, T., et al., "A 90nm High Volume Manufacturing Logic Technology Featuring Novel 45nm Gate Length Strained Silicon CMOS Transistors," 2003 IEEE, IEDM.
Shimizu, A., et al., "Local Mechanical-Stress Control (LMC): A New Technique for CMOS-Performance Enhancement." 2001 IEEE, IEDM, pp. 433-436.

* cited by examiner

*Primary Examiner*—Ngan Ngo
(74) *Attorney, Agent, or Firm*—Slater & Matsil, L.L.P.

(57) ABSTRACT

An integrated circuit chip includes a buffer layer, an underlying layer, a dielectric layer, a hole, and barrier layer. The buffer layer is over the underlying layer. The dielectric layer is over the buffer layer. The hole is formed in and extending through the dielectric layer and the buffer layer, and opens to the underlying layer. The hole includes a buffer layer portion at the buffer layer and a dielectric layer portion at the dielectric layer. At least part of the buffer layer portion of the hole has a larger cross-section area than a smallest cross-section area of the dielectric layer portion of the hole. The conformal barrier layer covers surfaces of the dielectric layer and the buffer layer in the hole. The hole is a via hole or a contact hole that is later filled with a conductive material to form a conductive via or a conductive contact.

16 Claims, 9 Drawing Sheets

CONTACT OR VIA HOLE STRUCTURE WITH ENLARGED BOTTOM CRITICAL DIMENSION

CROSS-REFERENCE TO RELATED APPLICATIONS

This application relates to the following co-pending and commonly assigned patent applications: None

TECHNICAL FIELD

The present invention generally relates to manufacturing integrated circuit chips and semiconductor devices. In one aspect it relates more particularly to a contact or via hole structure with an enlarged bottom critical dimension, and methods of making the same.

BACKGROUND

As the size of integrated circuit features on integrated circuit chips become smaller and the density of devices on integrated circuit chips increases, e.g., to increase device speed, new problems arise in scaling down the devices and interconnections. The size of conductive vias and contacts typically scale down to match the scaling down of other components and devices on integrated circuit chips. The minimum cross-section area of a via plug or contact plug is important to ensure that the via or contact does not have too much resistance to current flow. As used herein, the term "plug" is used broadly enough to include a conventional plug structure, as well as a structure formed using damascene and/or dual damascene processes.

FIG. 1 is a cross-section view of a via plug 20 formed using current processes. A buffer layer 22 is formed on an underlying layer 24 and a dielectric layer 26 is formed on the buffer layer 22. This buffer layer 22 may be an etch stop layer, for example. The via plug 20 in FIG. 1 is electrically connected to a conductive line 28 (e.g., copper line) in an underlying layer 24. The via hole 30 of FIG. 1 has a reduced cross-section area where it opens to the underlying layer 24 at the buffer layer 22. Using conventional methods of forming a via hole, often an anisotropic etch of the buffer layer 22 or etch stop layer is performed to provide a smooth slope for the via hole profile. Although this smooth slope may be desirable for other processing reasons (e.g., maintaining critical dimensions for upper portion of via hole, more uniform coverage of hole surfaces by barrier layer using PVD), etc., the reduced cross-section area at the buffer layer 22 will cause increased electrical resistance through the via plug 20.

FIG. 2 is a cross-section view showing a contact hole 32 formed between two transistors 34 and opening to a source/drain region 36. The transistors 34 have a buffer layer 22 formed over them, and the buffer layer 22 is covered by a dielectric layer 26. The buffer layer 22 of FIG. 2 has tensile stress to induce compressive strain on the channel regions 38 of the transistors 34 there below. When etching the contact hole 32 using conventional methods (e.g., anisotropic etch of buffer layer 22), the cross-section area of the contact hole 32 becomes smaller at the buffer layer 22. And in FIG. 2, the cross-section area of the contact hole 32 is smallest where it opens to the underlying layer 24 (which in this case is the substrate wherein source/drain region 36 is formed) due to the tapered profile of the contact hole 32 at the buffer layer 22. The negative effects of this tapering in the buffer layer 22 of FIG. 2 are not great because the buffer layer 22 is not thicker.

However, it is often desirable to have a thicker buffer layer 22 for inducing strain on the channel regions 38 of the transistors 34.

But as shown in FIG. 3, if the buffer layer thickness is increased, then the cross-section area of the contact hole 32 where it opens to the underlying layer 24 at the buffer layer 22 becomes smaller. Note that the size H of the contact hole opening at the underlying layer 24 in FIG. 2 is much larger than that of FIG. 3. The tapering effect in the buffer layer 22 created using conventional hole formation methods may preclude the use of thicker buffer layers 22. Hence, there is a need for an improved via hole or contact hole structure and a corresponding method of forming the same, that will allow for thicker buffer layers to be used and that will prevent the increase in resistance through a via or contact plug as the overall cross-section areas of such plugs continue to shrink to meet current production demands (e.g., as device dimensions shrink and as device density increases on a chip).

SUMMARY OF THE INVENTION

The problems and needs outlined above may be addressed by embodiments of the present invention. In accordance with one aspect of the present invention, an integrated circuit chip is provided, which includes a buffer layer, an underlying layer, a dielectric layer, a hole, and barrier layer. The buffer layer is over the underlying layer. The dielectric layer is over the buffer layer. The hole is formed in and extending through the dielectric layer and the buffer layer. The hole opens to the underlying layer. The hole includes a buffer layer portion at the buffer layer and a dielectric layer portion at the dielectric layer. At least part of the buffer layer portion of the hole has a larger cross-section area than a smallest cross-section area of the dielectric layer portion of the hole. The conductive and substantially conformal barrier layer covers substantially all surfaces of the dielectric layer and the buffer layer in the hole. The hole is a via hole or a contact hole that is later filled with a conductive material to form a conductive via or a conductive contact.

In accordance with another aspect of the present invention, an integrated circuit chip is provided, which includes a buffer layer, transistors, a dielectric layer, a contact hole, and a barrier layer. The buffer layer is formed over the transistors. The buffer layer has tensile stress to induce compressive strain on channels of the transistors. The buffer layer has a thickness within a range from about 300 angstroms to about 1000 angstroms. The dielectric layer is on the buffer layer. The contact hole is formed in and extending through the dielectric layer and the buffer layer. The contact hole extends between two of the transistors. The contact hole opens to part of at least one of the transistors. The contact hole includes a buffer layer portion at the buffer layer and a dielectric layer portion at the dielectric layer. At least part of the buffer layer portion of the contact hole has a larger cross-section area than a smallest cross-section area of the dielectric layer portion of the contact hole. The conductive and substantially conformal barrier layer covers substantially all surfaces of the dielectric layer and the buffer layer in the contact hole.

In accordance with yet another aspect of the present invention, a method of manufacturing an integrated circuit chip is provided. This method includes the following steps described in this paragraph. The order of the steps may vary, may be sequential, may overlap, may be in parallel, and combinations thereof, if not otherwise stated. A buffer layer is formed over a workpiece. A dielectric layer is formed over the buffer layer. A dielectric layer portion of a hole is formed through the dielectric layer using a first etch process. A buffer layer portion of the hole is formed through the buffer layer using a second etch process, such that at least part of the buffer layer portion of the hole has a larger cross-section area than a smallest cross-section area of the dielectric layer portion of the hole. A conductive and substantially conformal barrier layer is formed that covers substantially all surfaces of the dielectric layer and the buffer layer in the hole.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
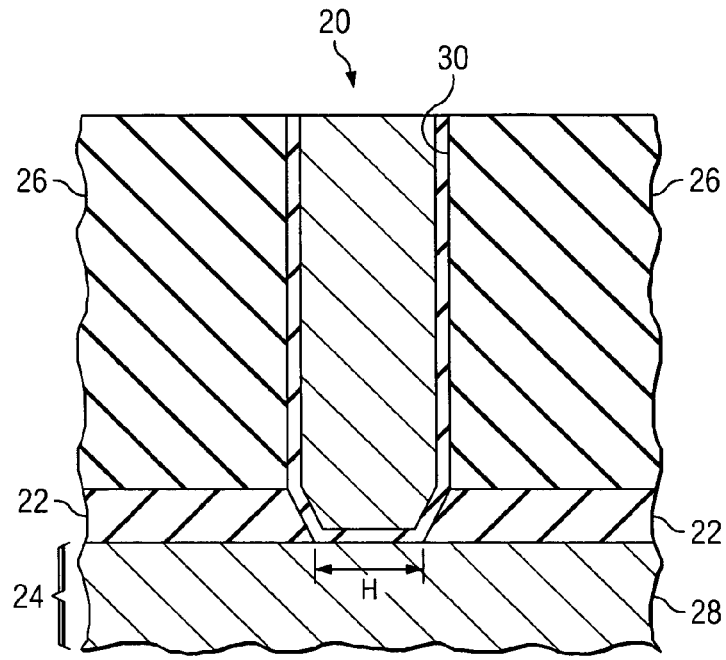
FIG. 1 is a cross-section view of a via plug formed using prior art processes.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention. Additional intervening layers may not be shown for purposes of simplifying the drawings.

Figure 4:
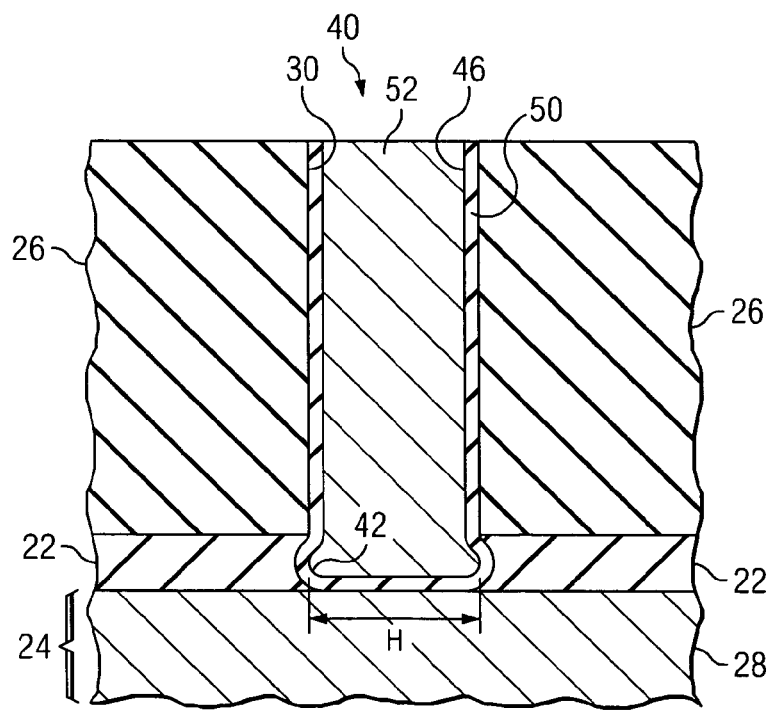
FIG. 4 illustrates a via plug formed in accordance with a first illustrative embodiment of the present invention.

Generally, an embodiment of the present invention provides via hole and contact hole structures with an enlarged bottom critical dimension at the buffer layer(s) (or etch stop layer(s)) and method(s) of making the same. FIG. 4 illustrates a via plug 40 formed in accordance with a first illustrative embodiment of the present invention. A cross-section view showing a portion of an integrated circuit chip is shown in FIG. 4. An underlying layer 24 in FIG. 4 includes a conductive line 28 (e.g., a copper line). The underlying layer 24 in the first embodiment is an intermetal dielectric (IMD) layer or an interlevel dielectric (ILD) that includes a dielectric material layer (not shown in FIG. 4) having the conductive line 28 formed therein. A buffer layer 22 is formed on the underlying layer 24. Although not shown, any number of intervening layers may be formed between the underlying layer 24 and the buffer layer 22. The buffer layer 22 may be an etch stop layer, for example. The buffer layer 22 may be any suitable material, including (but not limited to): SiN, SiON, SiC, SiOC, TiN, composites thereof, layers thereof, or combinations thereof, for example.

A dielectric layer 26 is formed over the buffer layer 22. Although not shown, any number of intervening layers may be formed between the dielectric layer 26 and the buffer layer 22. The dielectric layer 26 may be a low-k or ultra low-k dielectric material. Dielectric material used in any given dielectric layer in an embodiment may include (but not limited to): $SiO_2$, SOG, BPSG, TEOS, HDP oxide, USG, doped oxide, FSG with k in a range of about 1.2 to about 3.5, any suitable low dielectric constant material, or combinations thereof, for example. The thickness of any given dielectric layer will likely depend on the ILD or IMD thickness. The via hole 30 of the first embodiment is formed in and extends through the dielectric layer 26 and the buffer layer 22. The via hole 30 opens to the conductive line 28 of the underlying layer 24. The via hole 30 includes a buffer layer portion 42 of the hole 30 at the buffer layer 22 and a dielectric layer portion 46 of the hole 30 at the dielectric layer 26. As shown in FIG. 4, at least part of the buffer layer portion 42 of the via hole 30 has a larger cross-section area than a smallest cross-section area of the dielectric layer portion 46 of the via hole 30. A conductive and substantially conformal barrier layer 50 covers substantially all surfaces of the dielectric layer 26 and the buffer layer 22 in the via hole 30. Although not shown, any number of intervening layers may be formed between the barrier layer 50 and the dielectric layer 26 and/or the buffer layer 22. A metal via plug 40 is formed in the via hole 30 over the barrier layer 50 (see FIG. 4). Although not shown, any number of intervening layers may be formed between the barrier layer 50 and the via plug conductive material 52. Comparing the via plug 40 of the first embodiment (FIG. 4) with the via plug 20 of FIG. 1 shows that the first embodiment provides an enlarged bottom critical dimension.

Figure 3:
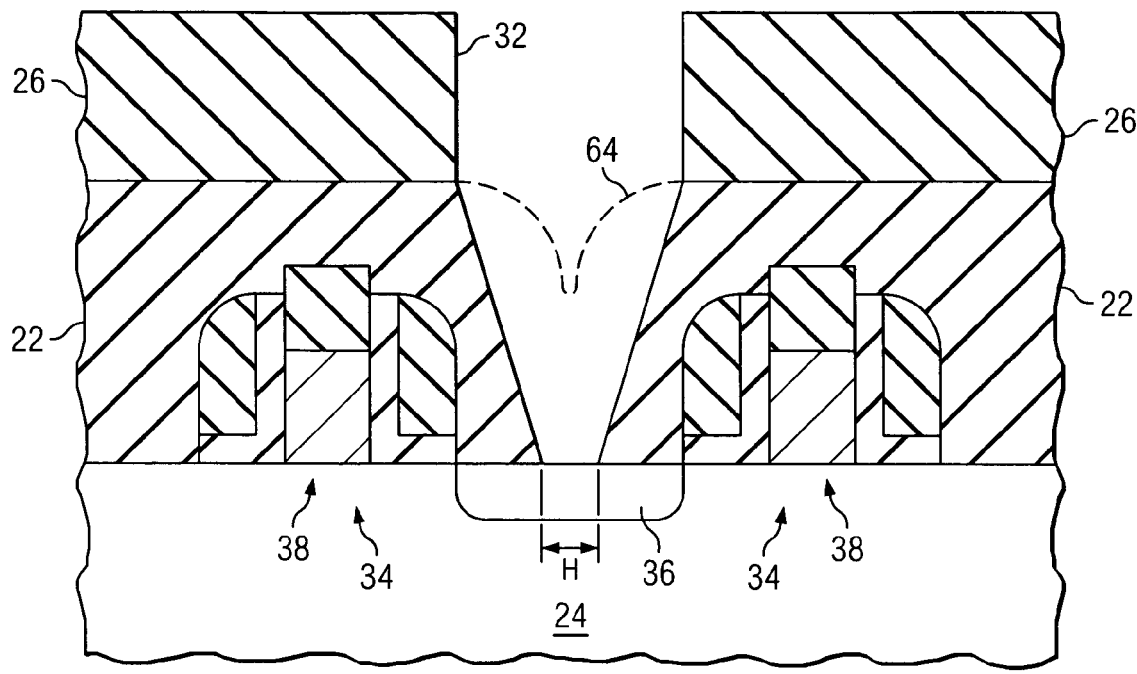
Figure 5:
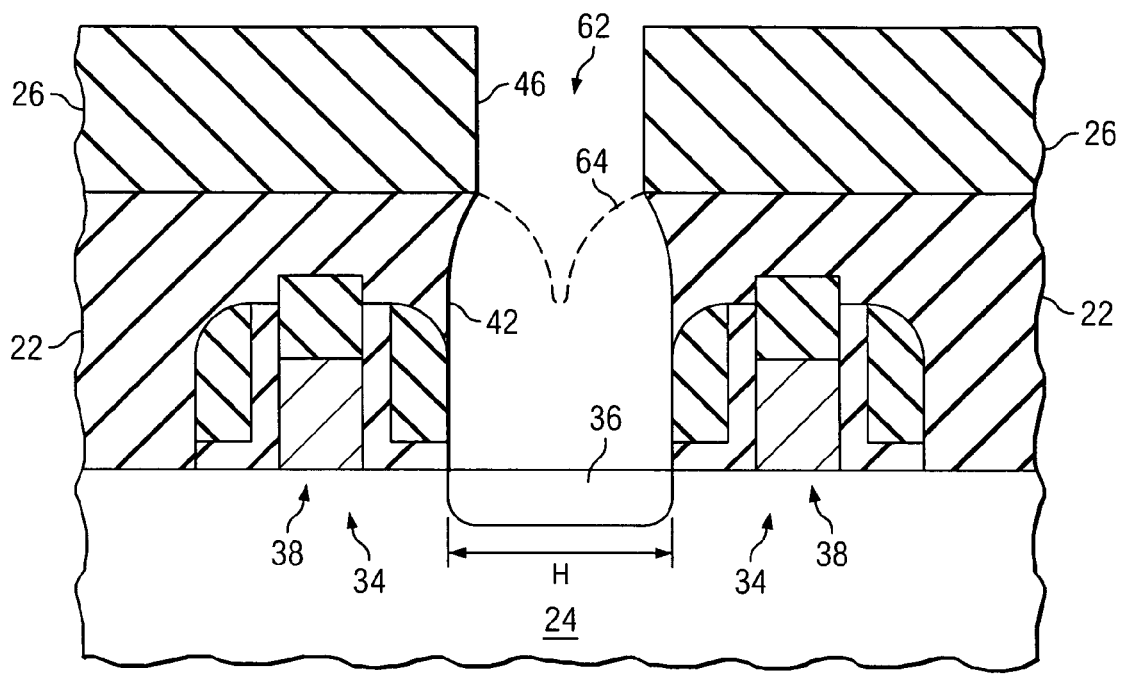
FIG. 5 shows a contact hole formed in accordance with a second illustrative embodiment of the present invention.

FIG. 5 shows a contact hole 62 formed in accordance with a second illustrative embodiment of the present invention. While devices shrink to 90 nm and below, at the same time thicker contact etch stop layers or buffer layers 22 (e.g., 300 to 1000 angstroms) are being used to gain strained silicon effects for improving channel current saturation limits. But as shown in FIG. 3 (discussed above), a thicker buffer layer 22 may cause the bottom critical dimension H to shrink to unacceptable sizes (e.g., bottom CD less than 100 nm). Using an embodiment of the present invention may provide a bottom critical dimension of about 500 nm instead of about 100 nm provided using conventional methods, as will be described further below. Yet, as devices shrink and the vias and contacts shrink, a bottom dimension of a hole 62 may be less than about 160 nm using an embodiment of the present invention.

Figure 2:
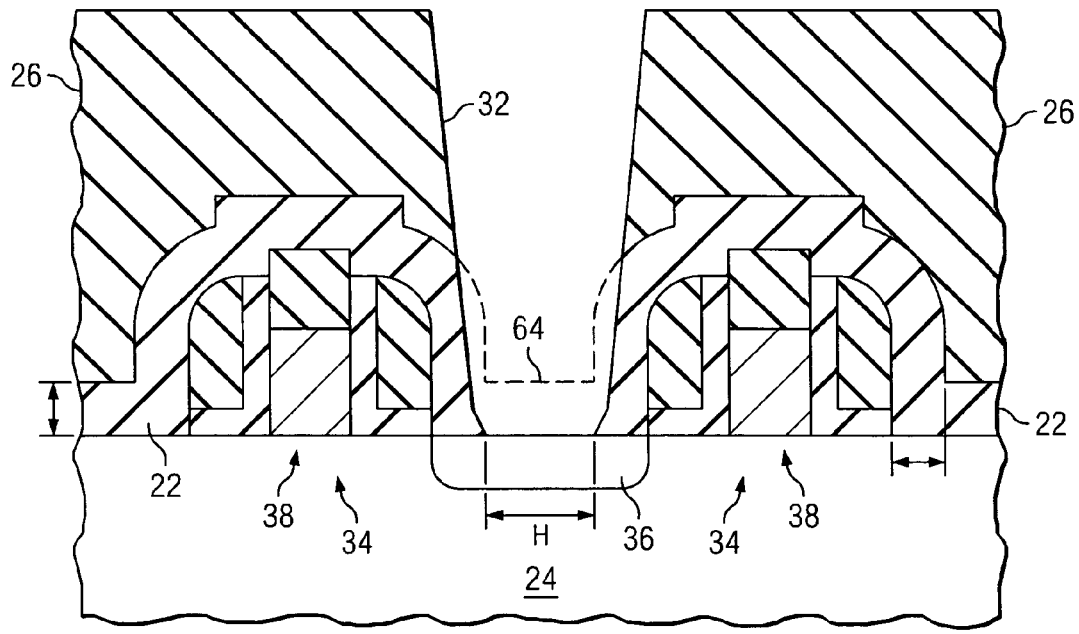
FIGS. 2 and 3 show cross-section views of a contact hole formed between two transistor using prior art processes.

FIG. 5 has the same transistor (34), buffer layer (22), and dielectric layer (26) structure as that of FIG. 3, except that the contact hole 62 has been formed using a method of the present invention. Although not shown, any number of intervening layers may be formed between the underlying layer 24 and the buffer layer 22. Similarly, any number of intervening layers may be formed between the dielectric layer 26 and the buffer layer 22. Note the difference in opening size H for the contact holes 32 and 62 in FIGS. 3 and 5, respectively, at the buffer layer 22. After forming the contact hole 62, a conductive and substantially conformal barrier layer (not shown in FIG. 5) may be formed to cover substantially all surfaces of the dielectric layer 26 and the buffer layer 22 in the contact hole 62. Although not shown, any number of intervening layers may be formed between the barrier layer and the dielectric layer and/or the buffer layer. The phantom lines 64 shown inside the contact holes 32 and 62 in FIGS. 2, 3, and 5 represent the top contour of the buffer layer 22 prior to forming the contact hole. In FIG. 5, the buffer layer 22 preferably has a thickness in a range from about 300 angstroms to about 1000 angstroms. A buffer layer 22 with such a thickness may provide a buffer layer stress in a range from about 0.7 GPA to about 1.5 GPA, for example. In the second embodiment, at least a portion of the buffer layer portion 42 of the contact hole 62 has a larger cross-section area than a smallest cross-section area of the dielectric layer portion 46 of the contact hole 62. Thus, the bottom critical dimension H of the contact hole 62 for the second embodiment (FIG. 5) is enlarged in comparison to that of FIG. 3. A benefit of enlarging the bottom critical dimension of a via hole or contact hole using an embodiment of the present is a reduced resistance across the via plug or contact plug. As an example of the dimensions achievable using an embodiment of the present invention, a via hole 40 or contact hole 62 may have a cross-section area of about 11310 nm$^2$ (e.g., about 120 nm in diameter) in a device using 90 nm technology.

Next, a method of forming an embodiment of the present invention will be described. The following method is considered a first method embodiment of the present invention for purposes of discussion herein. This first method may be used to form the first and second embodiments of FIGS. 4 and 5, respectively, for example. As will be discussed, this first method embodiment is a preferred method embodiment using a shrink method. A critical dimension shrink method may be achieved using a lithography method or an etch method, for example. A lithography method may have some constraints between resolution and depth of focus (DOF). Also, a scanner's numerical aperture (NA) may limit minimum critical dimension. In the example shrink method shown here (in FIGS. 6-17), which is currently preferred, an etch method will be used.

Figure 6:
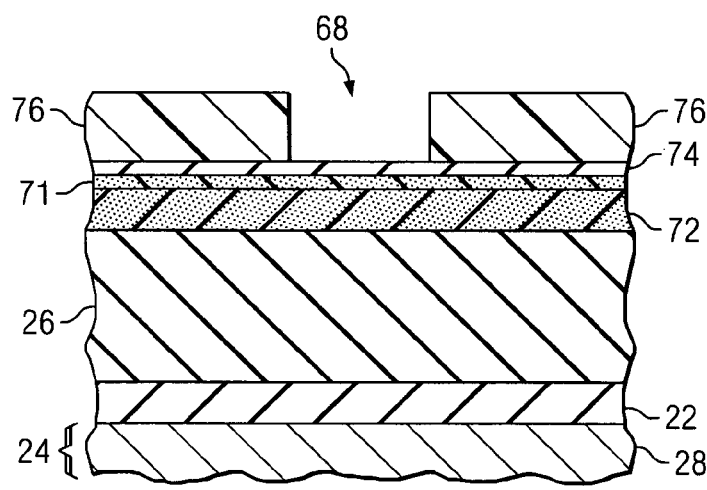
FIGS. 6-17 illustrate steps of the first illustrative method embodiment of the present invention, which may be used to form the first embodiment structure shown in FIG. 4.

FIGS. 6-17 illustrate steps of the first method embodiment, which may be used to form the first embodiment structure 40 shown in FIG. 4, for example. An intermediate structure 68 during a process of forming an intermetal dielectric (IMD) structure is shown in FIG. 6. The intermediate structure 68 of FIG. 6 has an underlying layer 24, which includes a dielectric layer (not shown in FIG. 6) and a conductive line 28 formed therein. A buffer layer 22 is formed over the underlying layer 24. Although not shown, any number of intervening layers may be formed between the underlying layer 24 and the buffer layer 22. A dielectric layer 26 is formed over the buffer layer 22. Although not shown, any number of intervening layers may be formed between the dielectric layer 26 and the buffer layer 22. A first antireflective coating 71 and a second antireflective coating (ARC) 72 are formed over the dielectric layer 26. Although not shown, any number of intervening layers may be formed between the dielectric layer 26 and the ARC layers 71, 72. A pad oxide layer 74 is formed over the ARC layers 71, 72. Although not shown, any number of intervening layers may be formed between the pad oxide layer 74 and the ARC layers 71, 72. A patterned photoresist mask layer 76 is formed over the pad oxide layer 74. Although not shown, any number of intervening layers may be formed between the pad oxide layer 74 and the photoresist layer 76. In other embodiments, a hard mask may be used rather than or in addition to a photoresist mask.

Figure 7:
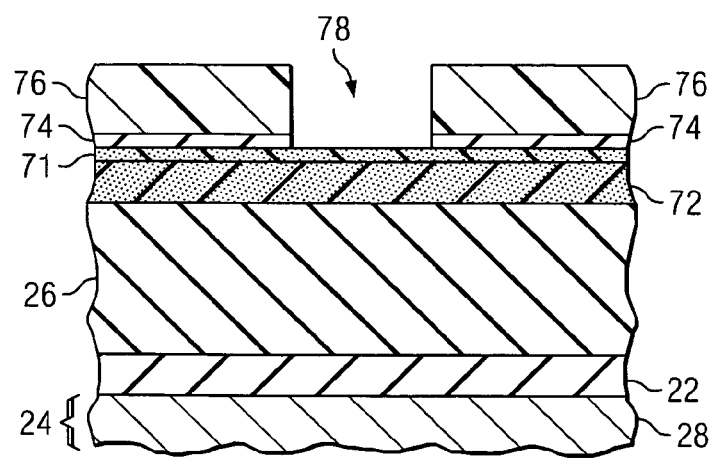
Figure 8:
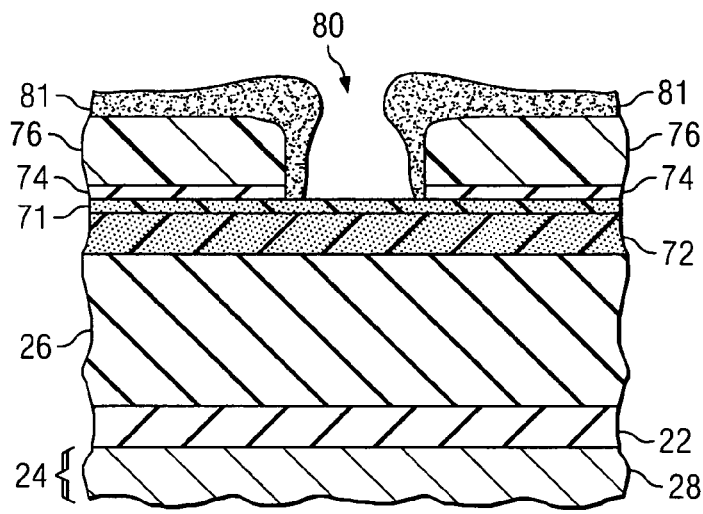
Figure 9:
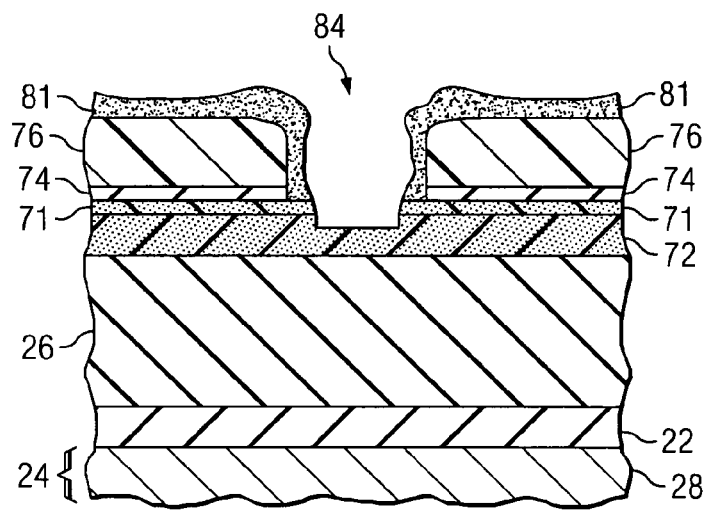
Figure 10:
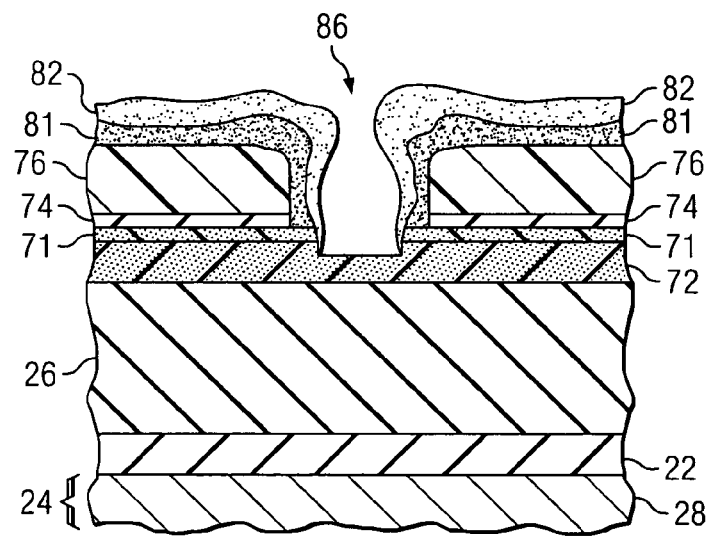
Figure 11:
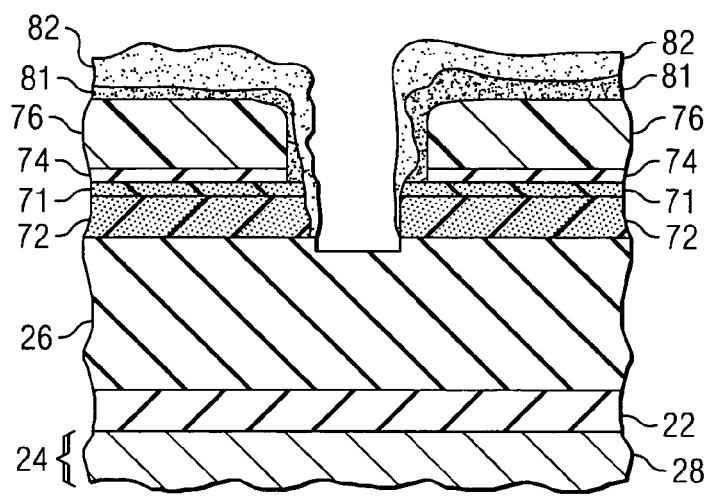

In FIG. 7, the pad oxide layer 74 has been opened in alignment with the patterned photoresist mask layer 76. A first polymer 81 is deposited over the intermediate structure 78 of FIG. 7 to provide the intermediate structure 80 of FIG. 8. In FIG. 9, the first ARC layer 71 is opened in alignment with the first polymer 81 over the patterned photoresist mask 76. A second polymer 82 is deposited over the intermediate structure 84 of FIG. 9 to provide the intermediate structure 86 of FIG. 10. The second polymer 82 may be a same or different material than the first polymer 81. Any suitable polymer may be used for the first and second polymers 81, 82, but preferably the first and second polymers 81, 82 may be removed during the photoresist strip to save processing steps (which is the case in this example). In FIG. 11, the second ARC layer 72 is opened in alignment with the second polymer 82 over the patterned photoresist mask 76.

Figure 12:
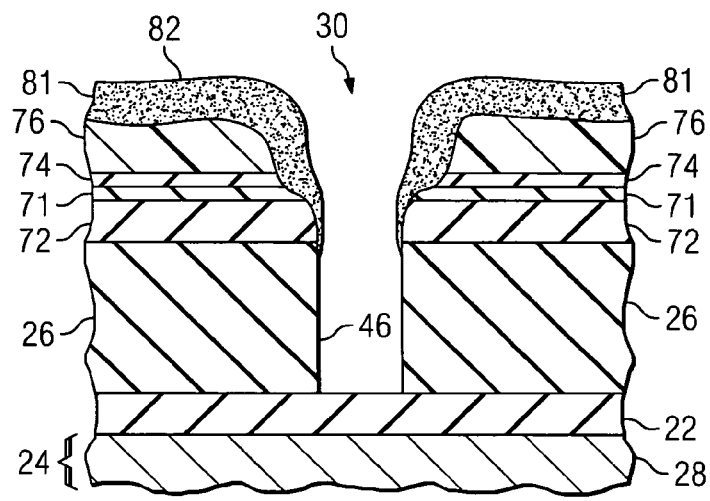

In FIG. 12, the dielectric layer portion 46 of the via hole 30 has been etched into the dielectric layer 26 in alignment with the remainder of the second polymer 82 over the patterned photoresist mask 76. Preferably, the etch of the dielectric layer 26 is an anisotropic etch (e.g., dry etch or RIE etch) to provide steep, substantially vertical, or vertical sidewalls for the via hole 30. The buffer layer 22 is used as an etch stop layer in the first method embodiment, which is preferred. Hence, the etch chemistry or etch process used for etching the dielectric layer 26 is preferably selective against etching the material selected for the buffer layer 22. In some cases, the buffer layer 22 may be slightly etched by dielectric etch to ensure that the dielectric layer etch is sufficiently completed. In other cases, corner residue and/or a thin residue layer of the dielectric layer material may remain at the bottom of the via hole 30 at the stage shown in FIG. 12 (i.e., after the dielectric layer etch).

Figure 13:
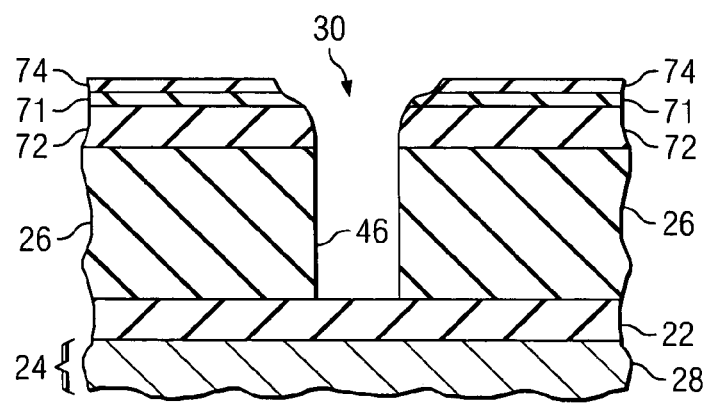
Figure 14:
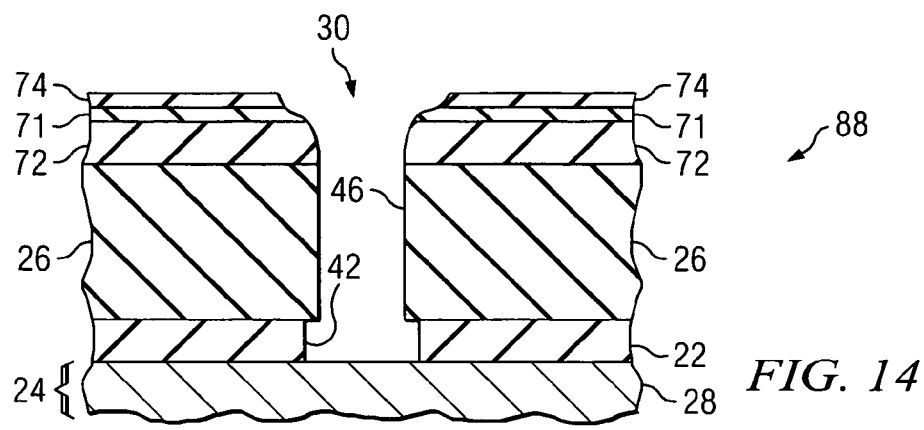

In FIG. 13, a resist strip has been performed (e.g., $O_2$ containing plasma) to remove the patterned photoresist mask 76. This resist strip also removes the polymers 81, 82 in this example. In other embodiments, a wet polymer removal step may be added, for example. In FIG. 14, the buffer layer 22 has been etched in alignment with the partially formed via hole 30. The buffer layer etch is preferably an isotropic etch or a lateral etch so that a cross-section area of the buffer layer portion 42 of the via hole 30 is larger than a smallest cross-section area of the dielectric layer portion 46 of the via hole 30. An etch chemistry for etching the buffer layer 22 may include fluorine, oxygen, or combinations thereof, for example. As another example, the buffer layer etch may include an oxygen containing plasma clean process. A wet chemistry clean including SPM, +AMP, DI/O3, or combinations thereof, may be used, for example, to etch the buffer layer 22. As yet another example, a wet chemistry etch with a fluoride containing solvent may be used to etch the buffer layer 22.

In another embodiment, the resist strip may be performed after the etching the buffer layer 22. In yet another embodiment, the buffer layer 22 may not be used as an etch stop layer. In such case, stopping the etching of the dielectric layer 26 may be determined using a time mode and/or an end point detect mode of etching, for example. When the buffer layer 22 is used as an etch stop layer, it is preferably a material with etch selectivity relative to the dielectric layer(s).

Figure 15:
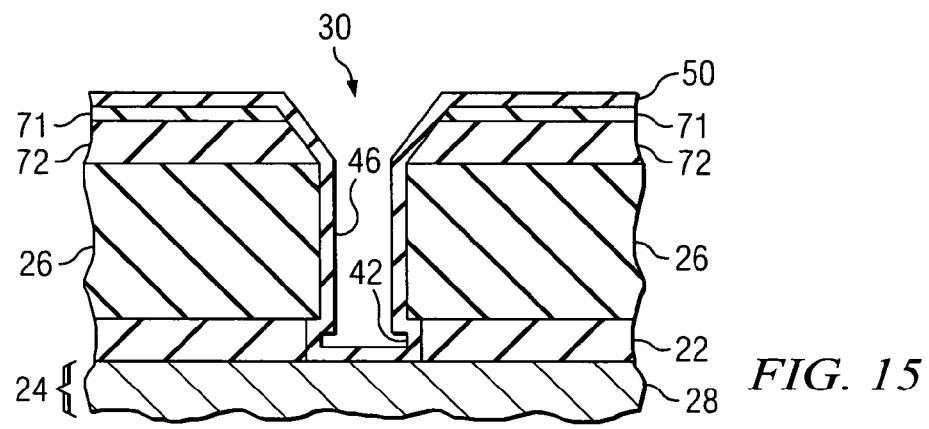

Referring now to FIG. 15, a conformal barrier layer 50 is formed over the intermediate structure 88 of FIG. 14. Preferably, this barrier layer 50 substantially covers the dielectric layer 26 and the buffer layer 22 in the via hole 30. A bottom critical dimension enlargement process of the present invention may cause barrier layer discontinuity if the barrier layer is not sufficiently conformal. For example, if a barrier metal discontinuity occurs, a tungsten CVC may easily create a "tungsten volcano" problem. $WF_6$ will attack the barrier layer discontinuity portion and cause abnormal deposition. When physical vapor deposition (PVD) was the mainstream process for depositing the barrier layer, it was more desirable to provide a smooth taper at the bottom of the via or contact hole to provide sufficient coverage because PVD provides about 70% conformity. Other forms of deposition may provide better conformity. For example, chemical vapor deposition (CVD) typically provides about 95% conformity and atomic layer deposition (ALD) may achieve 100% conformity. Thus, CVD or ALD are preferred for use in forming the barrier layer in an embodiment of the present invention. However, PVD of barrier layer may be used still to provide the conformity needed. For example, the barrier layer may be formed by using one or more PVD steps combined with one or more etch steps during the formation of the barrier layer. The barrier layer 50 of an embodiment may be made using any suitable barrier layer material, including (but not limited to): Ti, Ta, TiN, TaN, alloys thereof, or combinations thereof, for example.

Figure 16:
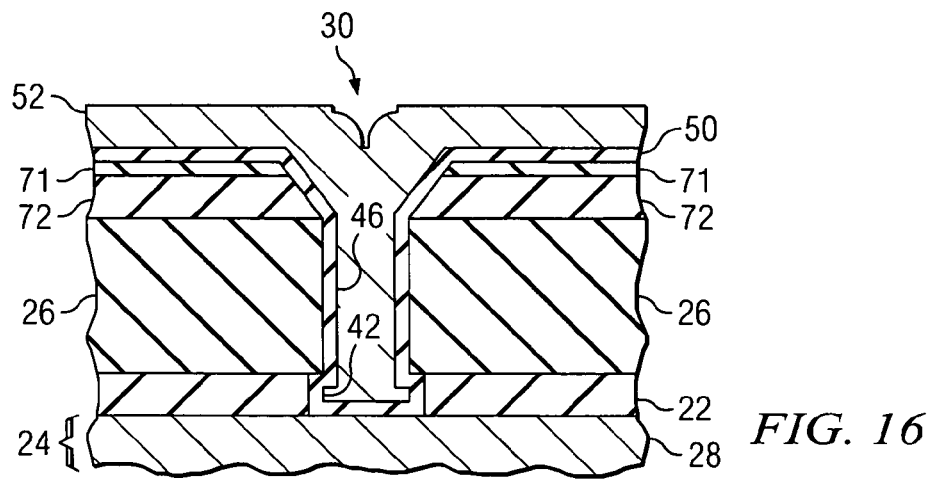

As shown in FIG. 16, a conductive plug material 52 is formed in the via hole 30 over the barrier layer 50. This conductive plug material 52 may be any suitable conductive material, including (but not limited to): metal, tungsten, copper, aluminum, doped polysilicon, titanium, tantalum, gold, alloys thereof, composites thereof, or combinations thereof, for example. Next, a chemical mechanical polish (CMP) and/or electrochemical mechanical polish (ECMP) process may be used to planarize the workpiece, remove the excess conductive plug material 52, remove the excess portions of the barrier layer 50, remove the pad oxide layer 74, and remove the ARC layers 71, 72. The resulting structure is that of FIG. 17, which may be the same as the structure 40 shown in FIG. 4.

Figure 17:
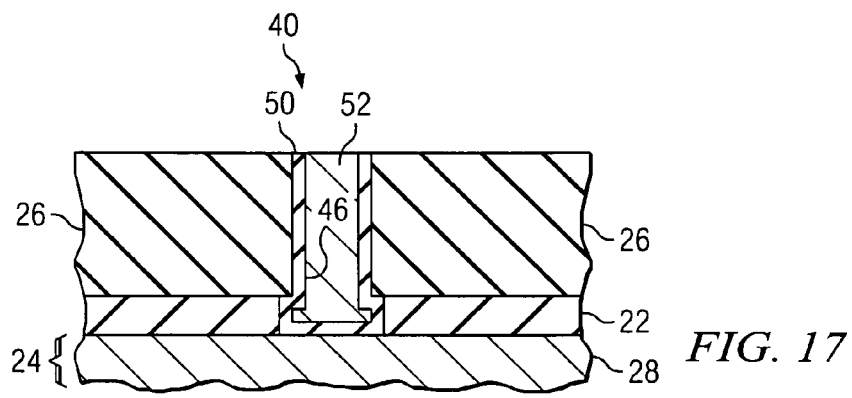
Figure 18:
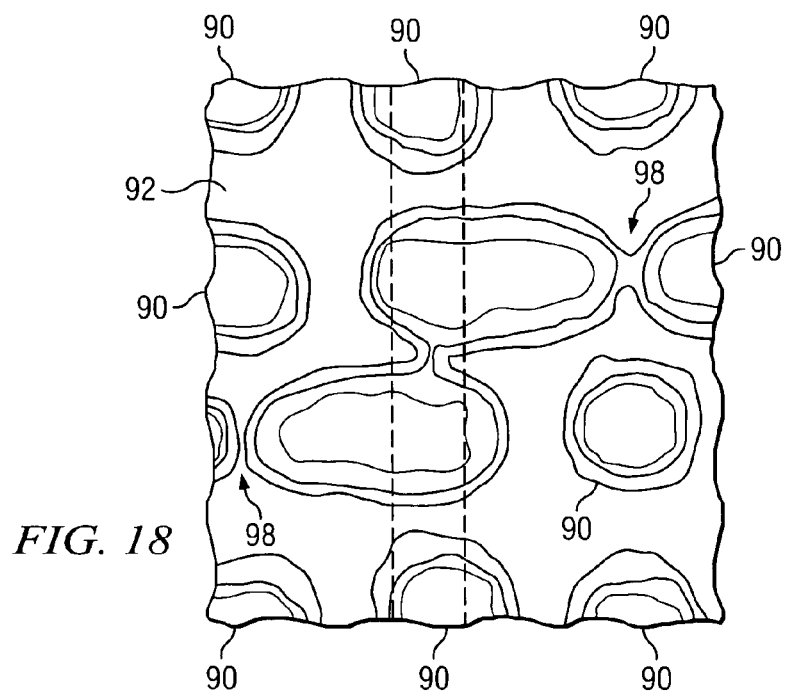
FIG. 18 is a top or plan view showing a set of vias or contacts formed in a work piece without using a CD shrink method.
Figure 19:
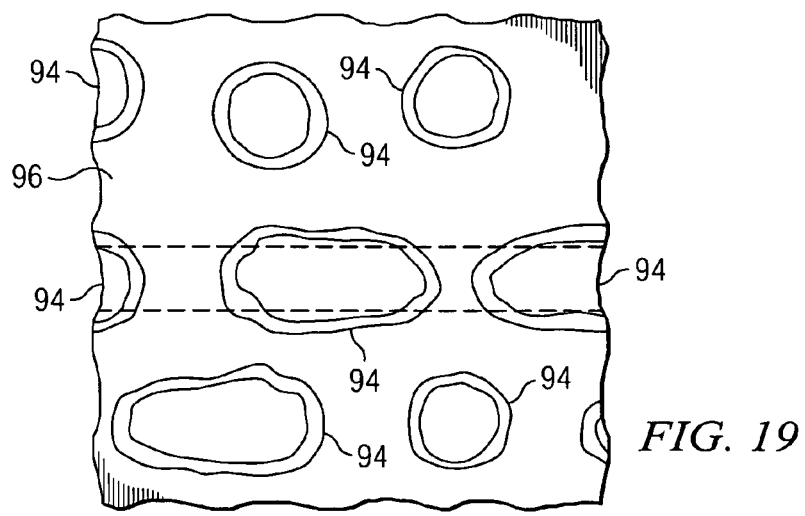
FIG. 19 is a top or plan view showing another set of vias or contacts formed in a work piece using a CD shrink method.

Note that the opening in the patterned mask layer 76 of FIG. 6 is larger than the top critical dimension of the via plug 40 shown in FIG. 17. This is due to the shrink method used, which incorporates the use of the polymer deposition steps (see e.g., FIGS. 8 and 10). FIGS. 18 and 19 illustrate one of the reasons why the use of the shrink method is preferred for providing smaller top critical dimensions. FIG. 18 is a top or plan view showing a set of vias or contacts 90 formed in a work piece 92 without using a CD shrink method. FIG. 19 is a top or plan view showing another set of vias or contacts 94 formed in a work piece 96 using a CD shrink method. The patterned mask used to form the workpieces 92, 96 in FIGS. 18 and 19 was identical. Yet, the conductors 94 in FIG. 19 are sufficiently separated from each other. As device dimensions shrink and device density increases, it becomes more difficult to keep conductors separated. In FIG. 18, there are several "bird's beak" regions 98 where the conductors 90 are not sufficiently separated. Such bird's beaks 98 can significantly decrease the yield when local interconnect contacts 90 become too close or even connect physically. As shown in FIG. 19, the shrink method can greatly improve the top critical dimensions and eliminate the bird's beak issue. In a preferred embodiment, the upper portion of via or contact plug (e.g., after shrink method processing) or the top critical dimension may be less than about 120 nm in diameter or less than 120 nm across in width, for example.

Figure 20:
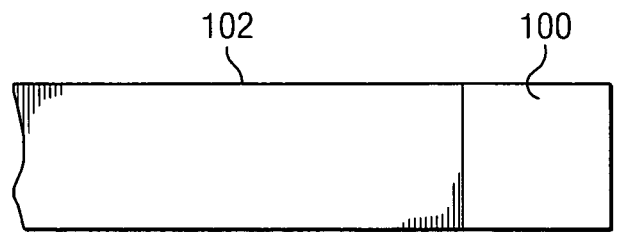
FIG. 20 shows a layout of a conductive via making a connection with an underlying conductive line.
Figure 21:
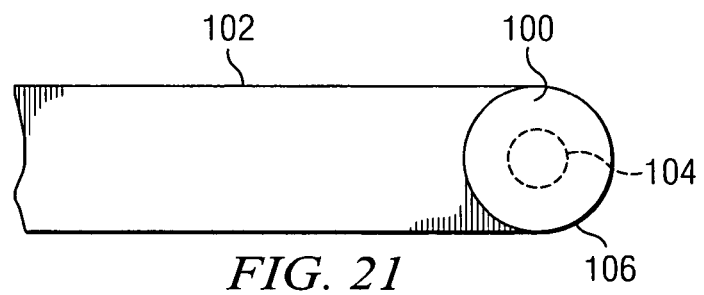
FIG. 21 shows a plan view of a via connecting with a conductive line below the via.
Figure 22:
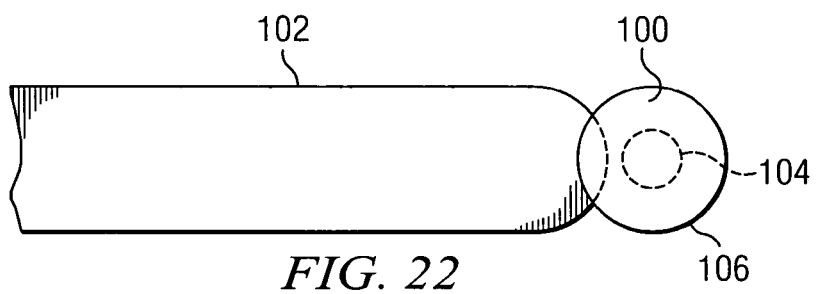
FIG. 22 shows a plan view of a via over a conductive line where the via is misaligned slightly relative to the underlying conductive line.

However, as the top critical dimensions shrink using the shrink method, another problem arises. The contact landing to match up one level with the level below becomes more difficult. Landing area of a contact is often critical to control resistance across the connection at the via or contact bottom. When a conductor on one level does not sufficiently match up with a conductor on a level below, the connection point may become smaller causing a higher resistance at the point of connection or the connection may not even be made, which will cause an open circuit. Such problems can also be disastrous on production yield. FIGS. 20-23 help to illustrate these points. FIG. 20 shows an ideal layout of a conductive via 100 making a connection with an underlying conductive line 102, for example. However, an actual via will typically be round, rounded, or elliptical, rather than being square or rectangular. Also using conventional methods, a via will have a tapered bottom (see e.g., FIG. 1). This is illustrated in FIG. 21, where the via 100 has a round cross-section shape. FIG. 21 is similar to FIG. 20, it shows a plan view of a via 100 connecting with a conductive line 102 below the via 100. The dashed line 104 in FIG. 21 represents the bottom critical dimension of the via 100. In FIG. 22 the configuration of FIG. 21 is shown, but the via 100 is misaligned slightly relative to the underlying conductive line 102. Although the overall via profile overlaps with the conductive line 102, the bottom 104 of the via 100 does not physically contact the conductive line 102 as it should. Thus, the configuration in FIG. 22 is an open circuit that may cause the chip to be defective.

Figure 23:
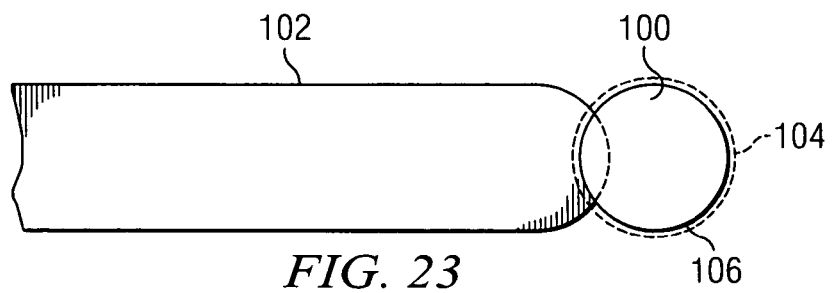
FIG. 23 shows a plan view of a via over a conductive line where the via is misaligned slightly relative to the underlying conductive line, and the bottom critical dimension of the via has been enlarged using an embodiment of the present invention.

In FIG. 23, the same via alignment mismatch that occurred in FIG. 22 is shown, except that the bottom critical dimension 104 of the via 100 has been enlarged using an embodiment of the present invention. Even though the top critical dimension 106 of the via 100 in FIG. 23 is in the same location as that of FIG. 22, the bottom critical dimension 104 is much different. The enlarged buffer layer portion of the via 100 in FIG. 23 makes the difference in whether the circuit is open or not. Thus, the use of an embodiment of the present invention to provide an enlarged bottom critical dimension can improve the production yield when inevitable alignment mismatches occur. And when there is not an alignment mismatch, the enlarged bottom critical dimension of the via or contact can improve the resistance across the via or contact by as much as about 20% or more, as compared to use of conventional methods of forming vias and contacts. In a typical via, for example, the resistance across the via may be improved by about 3% to about 10% by use of an embodiment of the present invention, as compared to use of conventional methods.

Another advantage of providing an enlarged bottom critical dimension for a via or contact is an improved adhesion between the via or contact plug and the underlying layer or line. This can mean less failures due to plug pull-outs (e.g., during CMP) and less separations (opens) caused by such plug pull-outs (or plug pull-ups).

A via or contact of an embodiment may have any suitable shape in a plan view. In a preferred embodiment, a contact or via may have a generally elliptical shape, a peanut shape, rhombus shape, a generally L shape, a rounded corner shape, or a round shape, in a plan view for example (see e.g., FIG. 19).

Figure 24:
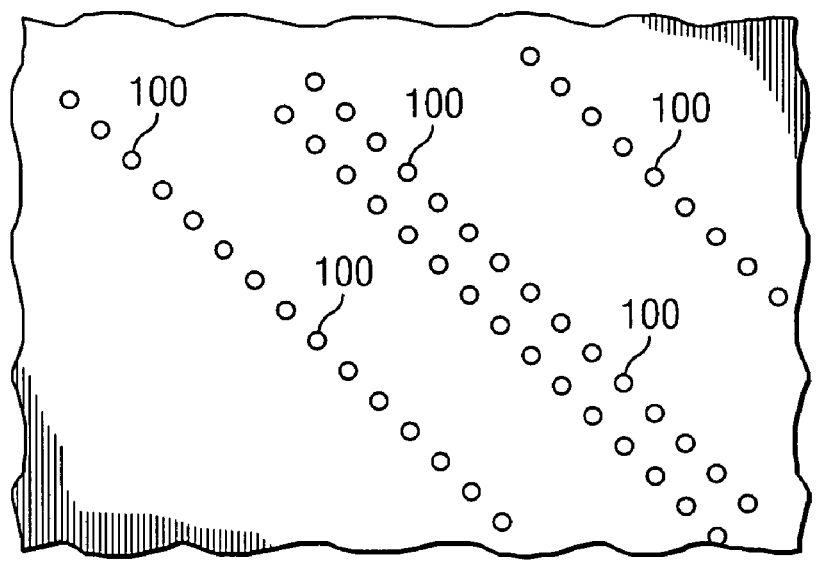
FIGS. 24 and 25 show two different illustrative mask pattern densities for vias or contacts.
Figure 25:
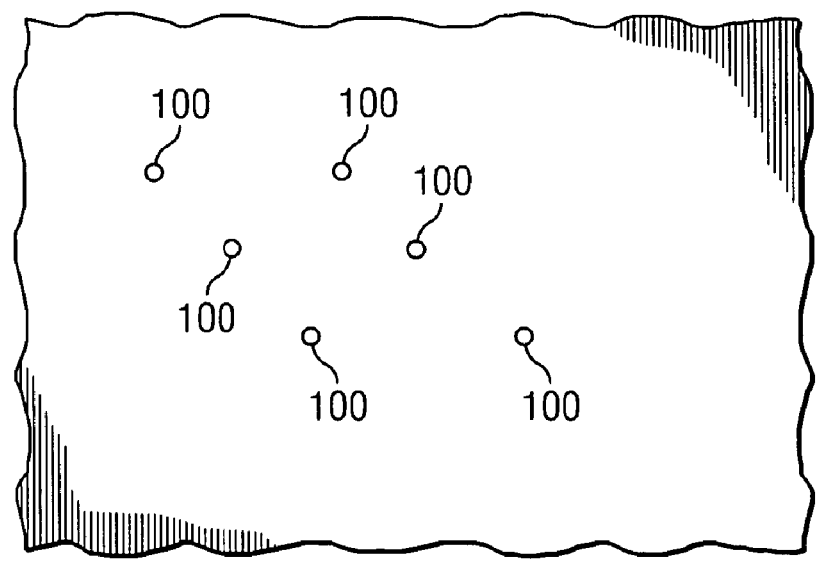

FIGS. 24 and 25 illustrate two different mask pattern densities for vias or contacts 100. Using conventional processes, mask pattern density decreases would cause the via or contact profile to be more tapered due to micro loading effects. As discussed above, such tapering is undesirable. Using a bottom critical dimension enlargement process or embodiment of the present invention, however, is insensitive to mask pattern density changes. Thus, using an embodiment of the present invention, a same etch recipe may be applied to different mask pattern densities. This is yet another advantage that may be provided by an embodiment of the present invention. An embodiment of the present invention may be used for hole mask pattern densities in a range from about 0.01% to about 40%, for example.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip comprising:
   a buffer layer over an underlying layer, the buffer layer being formed of a dielectric material;
   a dielectric layer over the buffer layer;
   a hole formed in and extending through the dielectric layer and the buffer layer,
      wherein the hole opens to the underlying layer, and
      wherein the hole comprises a buffer layer portion at the buffer layer and a dielectric layer portion at the dielectric layer,
      wherein at least part of the buffer layer portion of the hole has a larger cross-section area than a smallest cross-section area of the dielectric layer portion of the hole; and
   a conductive and substantially conformal barrier layer covering substantially all surfaces of the dielectric layer and the buffer layer in the hole.

2. The integrated circuit chip of claim 1, wherein the buffer layer has a thickness within a range from about 300 angstroms to about 1000 angstroms.

3. The integrated circuit chip of claim 2, wherein the buffer layer is formed on a transistor, the hole is a contact hole that opens to part of the transistor, and the buffer layer has tensile stress or compressive stress to induce compressive strain on a channel of the transistor.

4. The integrated circuit chip of claim 1, wherein the smallest cross-section area of the dielectric layer portion is less than about 11310 nm$^2$.

5. The integrated circuit chip of claim 1, wherein the hole has a generally elliptical plan view shape.

6. The integrated circuit chip of claim 1, further comprising a conductor formed in the hole over the barrier layer.

7. The integrated circuit chip of claim 1, wherein the underlying layer comprises a conductive line and wherein the hole is a via hole opening to the conductive line.

8. The integrated circuit chip of claim 1, wherein the buffer layer is an etch stop layer.

9. An integrated circuit chip comprising:
   a buffer layer formed over transistors, the buffer layer having tensile stress or compressive stress to induce compressive strain on channels of the transistors, and the buffer layer having a thickness within a range from about 300 angstroms to about 1000 angstroms;
   a dielectric layer on the buffer layer;
   a contact hole formed in and extending through the dielectric layer and the buffer layer,
      the contact hole extending between two of the transistors;
      the contact hole opening to part of at least one of the transistors, and
      the contact hole comprising a buffer layer portion at the buffer layer and a dielectric layer portion at the dielectric layer,
      wherein at least part of the buffer layer portion of the contact hole has a larger cross-section area than a smallest cross-section area of the dielectric layer portion of the contact hole; and
   a conductive and substantially conformal barrier layer covering substantially all surfaces of the dielectric layer and the buffer layer in the contact hole.

10. The integrated circuit chip of claim 9, wherein the barrier layer is formed by chemical vapor deposition.

11. The integrated circuit chip of claim 9, wherein the barrier layer is formed by one or more physical vapor depositions combined with one or more etch steps during the formation of the barrier layer.

12. The integrated circuit chip of claim 9, wherein the contact hole is formed by a shrink method.

13. The integrated circuit chip of claim 9, wherein the smallest cross-section area of the dielectric layer portion for the contact hole is less than about 11310 nm$^2$.

14. The integrated circuit chip of claim 9, wherein the contact hole has a generally elliptical plan view shape.

15. The integrated circuit chip of claim 9, further comprising a conductor formed in the contact hole over the barrier layer.

16. The integrated circuit chip of claim 9, wherein the buffer layer is an etch stop layer.

* * * * *